United States Patent [19]

Etrillard

[11] Patent Number: 5,318,950
[45] Date of Patent: Jun. 7, 1994

[54] JOSEPHSON DEVICE OR JUNCTION AND ITS PRODUCTION PROCESS

[75] Inventor: Jackie Etrillard, St Arnoult en Yuelines, France

[73] Assignee: France Telecom Etablissement (Autonome de Droit Public), France

[21] Appl. No.: 9,871

[22] Filed: Jan. 27, 1993

[30] Foreign Application Priority Data

Feb. 3, 1992 [FR] France ............................ 92 01155

[51] Int. Cl.$^5$ .................... H01B 12/00; H01L 39/12; B44C 1/22
[52] U.S. Cl. ................................ 505/329; 156/643; 156/649; 156/655; 156/659.1; 156/667; 505/832; 505/413; 437/910
[58] Field of Search ............... 156/643, 649, 650, 656, 156/655, 657, 659.1, 661.1, 667; 505/1, 702, 728, 832; 427/62, 63; 204/192.24; 257/31, 37–39; 365/162; 357/5; 437/189, 228, 910

[56] References Cited

U.S. PATENT DOCUMENTS

5,047,390 9/1991 Higashino et al. ............. 505/702 X
5,051,396 9/1991 Yamazaki ........................ 437/910 X

FOREIGN PATENT DOCUMENTS

0422641 4/1991 European Pat. Off. .

OTHER PUBLICATIONS

Japanese Journal of Applied Physics, vol. 24, No. 10, Oct. 1985, Tokyo, JP, pp. 1312–1315; Y. Okabe et al.: "Josephson Junctions with Short Semiconductor Links Separated by Oxidized Layer".
IEEE Electron Device Letters, vol. EDL-7, No. 5, May, 1986, New York, US, pp. 285–287; C. R. Musil et al.: "Focused Ion Beam Microsurgery for Electronics".
Transactions of the IEICE of Japan/Section E, vol. E70, No. 4, Apr. 1987, Tokyo, JP, pp. 389–391; M. Hiraki et al.: "Coplanar Silicon-Coupled Josephson Junctions with Recessed Electrode Structure".
Microelectronic Engineering, vol. 4, No. 3, 1986, Amsterdam, NL, pp. 163–179; H. Morimoto et al.: "Focused Ion Beam Lithography and Its Application to Submicron Devices".
Japanese Journal of Applied Physics, vol. 26, No. 8, Aug. 1987, pp. L1320–L1322; Toshikazu Nishino et al.: "Light Detection by Superconducting Weak Link Fabricated with High-Critical-Temperature Oxide-Superconductor Film".
American Institute of Physics, Applied Physics Letters, vol. 56, No. 7, Feb. 12, 1990, pp. 686–688; R. B. Laibowitz et al.: "All High $T_c$ Edge Junctions and SQUIDS".
American Institute of Physics, Applied Physics Letters, vol. 58, No. 7, Feb. 18, 1991, pp. 765–767; Mohammed E. Tidjani et al.: "Heteroepitaxial $YBa_2Cu_3O_{7-x}$-$SrTiO_3$-$YBa_2Cu_3O_{7-x}$ Trilayers Examined by Transmission Electron Microscopy".
American Institute of Physics, Applied Physics Letters, vol. 58, No. 7, Feb. 18, 1991, pp. 753–755; D. K. Chin et al.: "Novel All-High $T_c$ Epitaxial Josephson Junction".
American Institute of Physics, Applied Physics Letters, vol. 58, No. 6, Feb. 11, 1991, pp. 634–636; G. Koren et al.: "Properties of All $YBa_2Cu_3O_7$ Josephson Edge Junctions Prepared by in situ Laser Ablation Deposition".
American Institute of Physics, Applied Physics Letters, vol. 56, No. 7, Feb. 12, 1990, pp. 683–685; K. Hirata et al.: "Tunneling Measurements on Superconductor/Insulator/Superconductor Junctions Using Single-Crystal $YBa_2Cu_3O_{7-x}$ Thin Films".
American Institute of Physics, Applied Physics Letters, vol. 58, No. 5, Feb. 4, 1991, pp. 543–545; K. P. Daly et al.: "Substrate step-edge $YBa_2Cu_3O_7$ rf SQUIDS".

Primary Examiner—William Powell
Attorney, Agent, or Firm—Pearne, Gordon, McCoy & Granger

[57] ABSTRACT

This device or junction is essentially constituted by a substrate made from an electrically insulating material (2), a vertical wall (4) formed on the substrate and extending in a given direction (x), said wall being made from said insulating material, a superconducting material ribbon (8) in two separate parts (10, 12) located on either side of the wall and bearing on the latter, the ribbon being oriented in a direction perpendicular to the said direction, and two interconnection contacts (14, 16) respectively placed on the two portions of the ribbon.

10 Claims, 3 Drawing Sheets

JOSEPHSON DEVICE OR JUNCTION AND ITS PRODUCTION PROCESS

The present invention relates to a Josephson device or junction, as well as to its production process. This junction can be used in the field of integrated circuits using superconducting layers, as well as semiconducting material it forms a basic component for switching.

In particular, the junction according to the invention can be used for producing fast logic circuits such as those known under the name "SQUIDS" (superconducting quantum interference devices).

At present two procedures exist for producing Josephson junctions and make use of superconducting materials, generally based on mixed copper oxide.

The first method is based on the use of the natural junctions existing at the joints of the grains of superconducting ceramics produced at high temperatures, or artificial junctions, i.e. created by constriction (Dayem bridges, point contact diodes, etc.) or by sudden crystalline disorganization of the superconducting material during an abrupt step passage or edge junction on the substrate.

Edge junctions are in particular described by K. P. Daly et al, Appl. Phys. Lett. 58(5) of 4.2.1981, "Substrate step-edge $YBa_2Cu_3O_7$rf SQUIDs", pp 543-545; R. B. Laibowitz et al, Appl. Phys. Lett., 56(7) of 12.2.1990, "All high Tc edge junctions and SQUIDs", pp 686-688; and T. Nishino et al, Japanese Journal of Appl. Phys., vol. 26, No. 8, August 1987, pp L1320-L1322, "Light Detection by superconducting weak link fabricated with high-critical-temperature oxide-superconductor film".

The second method is based on producing a superconductor-insulator-superconductor sandwich, known as SIS. This second method generally uses barriers a few mm thick, epitaxied onto superconducting ceramics, in the case of high temperature materials. Generally it gives rise to a transition in the axis perpendicular to the plane of the copper atoms of the superconducting materials.

This SIS method is in particular described by G. Koren et al, Appl. Phys Lett., 58(6) of 11.2.1991, "Properties of all $YBa_2Cu_3O_7$ Josephson edge junctions prepared by in situ laser ablation deposition", pp 634-636; D. K. Chin and T. Van Duzer, Appl. Phys. Lett., 58(7) of 18.2.1991, "Novel all-high Tc epitaxial Josephson junction", pp 753-755; and M. E. Tidjani and R. Gronsky, Appl. Phys. Lett., 58(7) of 18.2.1991, "Heteroepitaxial $YBa_2Cu_3O_{7-x}$—$SrTiO_3$—$YBa_2Cu_3O_{7-x}$ trilayers examined by transmission electron microscopy", pp 765-767.

These two methods suffer from a certain number of disadvantages.

With regards to the first method consisting of creating grain joints or the use of those naturally existing in the material, it is found that the functional characteristics of Josephson junctions are completely dependent on the width of the joints (a priori random widths), but also on their chemical and physiochemical evolution.

With regards to natural grain joints, apart from the major difficulty of locating them (their distribution being substantially random), it is difficult to obtain therefrom junctions having reproducible characteristics, in view of the fact that the critical densities are a function of the structure of the joints in question.

With regards to grain joints created e.g. in junctions of the edge junction type, it is important to note that only in situ constructions make it possible to obtain reproducible results (cf. the article by G. Koren et al). Unfortunately, this method makes it necessary to deposit materials through masks having a mediocre definition and a geometry specific to said method. The alignment of the masks is also imprecise, so that it is difficult to obtain patterns having microelectronic sizes.

Conventional lithography can be used in this method, but it is then necessary to work with layers exposed to the air, hence the appearance of impurities and/or modifications in the composition of the materials, with poorly controlled interfaces between the layers.

Adsorptions and possible physicochemical reactions then occur and lead to the nonreproducibility of the properties of the thus produced junctions.

This more particularly applies if an insulating layer a few nm thick is added to this structure, as stated in the aforementioned article by R. B. Laibowitz et al and which constitutes a mixed construction, namely the creation of a grain joint and an insulating barrier. This barrier is produced by oxidation with the aid of a reactive plasma.

With regards to the second method using successive deposits of superconducting material, insulating material and once again superconducting material, it is necessary to be able to perfectly control the insulator thickness, which must be approximately the characteristic coherence distance of the material.

In this crystalline direction, said coherence distance or length is extremely small. Thus, there are very considerable technical problems to be solved in the SIS method, both with regards to its metrology and its accuracy, as well as with regards to its reproducibility (cf. the article by K. Kirata et al., Appl. Phys. Lett., 56(7) of 12.2.1990, pp 683-685 "Tunneling measurements on superconductor-insulator-superconductor junctions using single-crystal $YBa_2Cu_3O_{7-x}$ thin films".

The experimental results have rapidly revealed that it was indispensable to produce the superconductor-insulator-superconductor junctions by epitaxial growth in situ, in order to avoid inevitable adsorptions and evolutions and the non-reproducibility resulting therefrom. This method does not enable any lithographic process to be used.

In addition, to all these problems of non-reproducibility of Josephson devices is added the difficulty of obtaining high critical currents, i.e. directly in the plane of the copper atoms of the superconducting material, particularly in the case of edge junctions, which reduces the immunity of the devices or junctions to noise.

The object of the invention is a novel Josephson junction and its production process making it possible to obviate the various disadvantages referred to hereinbefore.

The idea of the invention is to use a Josephson barrier no longer positioned horizontally or in an oblique plane, as takes place in the prior art, but instead vertically. Thus, the major technical problem encountered by the preceding constructions and which consists of producing a vertical pattern of insulating material with a width of a few nm can be solved by using a parasitic effect which, under certain conditions, a appears during cathodic sputtering or ion bombardment.

In the case of superconducting materials with a high superconducting transition temperature, there is a very high conductivity anisotropy, e.g. in the plane of copper atoms (crystallographic plane a, b) of superconducting materials, the conductivity is much higher than in the perpendicular plane (axis c).

In addition, the coherence distance is also greater in the plane (a,b), which facilitates the production of the junction making it possible to obtain a barrier several nanometres thick. This could be fundamental if the theoretical models calling on excitonic coupling proved to be applicable. In addition, in said crystalline direction, the critical current densities are higher, which makes it possible to envisage a greater immunity to noise of the junctions according to the invention.

More specifically, the invention relates to a Josephson junction essentially constituted by a substrate of an "electrically insulating" material, a vertical wall formed on the substrate and extending in a given direction, said wall being made from an insulating material having a composition identical to the material of the substrate, a superconducting material ribbon in two separate parts and located in the same plane on either side of the wall and bearing on the latter, the ribbon being oriented in a direction perpendicular to said direction, as well as two interconnection contacts respectively placed on the two ribbon portions.

The wall or barrier is produced from a stable insulator with no reactive chemisorption. It has a height between 100 and 1000 nm and a width below 10 nm.

The term "electrical insulator" is understood to mean any material not or only slightly conductive of electricity, such as insulators and semiconductors.

The invention is applicable to any insulating or semiconducting substrate compatible with superconducting material production procedures. In particular, said substrate can be of MgO, $SrTiO_3$, $LaAlO_3$, $LaGaO_3$, GaAs, InP, Si, $Al_2O_3$, Y.S.Z. (yttrium-stabilized zirconia). The superconducting material can be a material with a high or low superconducting transition temperature.

As materials usable within the scope of the invention, reference can be made to $YBa_2Cu_3O_7$ (known under the abbreviation YBCO), $TlBa_{2-x}Ca_xCu_3O_7$, with $0<x<2$, $BiSr_{2-y}Cu_3O_7$, with $0<y<2$, $Bi_{1-z}Pb_zSr_{2-u}Ca_uCu_3O_7$ with $0<z<1$ and $0<u<2$. In particular, the wall and substrate are made from MgO and the superconducting ribbon of $Bi_{1-z}Pb_zSr_{2-u}Ca_uCu_3O_7$, designated BiPbSrCaCuO.

The interconnection lines can be made from any random conducting material and in particular a metal, such as e.g. silver, platinum, gold or alloys thereof. Preferably, use is mad of gold or gold alloy interconnection lines.

Therefore the idea of the present invention is to produce a vertical insulating barrier through a superconducting material ribbon. This type of pattern can easily be obtained by conventional lithography using redepositions of flanks conventionally observed in dry etching. The superconducting ribbon is obtained in a single stage either using the lift-off procedure, or by etching after producing the insulating barrier. This aspect of the method is important, because it makes it possible to reinforce the reproducibility of the procedure, because the junction is produced in situ.

Therefore this method leads to reproducible junctions in the plane (a, b), where the coherence distance is greater and where the critical current is higher. It also makes it possible to use all conventional integration methods suitable for microelectronics, because it permits the alignment of masks and very high definition lithography processes.

Therefore the invention also relates to a process for the production of a Josephson device or junction as described hereinbefore. This process consists of forming on an appropriate electrically insulating material substrate, a step of a material different from that of the substrate, machining the substrate with a focused ion beam in order to form on the flank of the step a vertical redeposition wall of said insulating material extending in a given direction, forming a superconducting ribbon oriented perpendicularly to the wall and having two separate portions, located in the same plane on either side of said wall and bearing on the latter and producing two interconnection contacts respectively on the two separate portions of the ribbon.

The invention makes use of a focused ion beam for carrying out a redeposition of the substrate on the flank of the step and not a reactive, unfocused plasma, which reacts chemically with the material to be etched in accordance with the prior art.

According to a first variant of this process, the following stages are performed:

a) deposition of a resin layer on an appropriate, thermally stabilized, electrically insulating material substrate, b) etching the stabilized resin in such a way as to only mask that region of the substrate on which the junction is to be produced, c) ionic machining of the masked substrate leading to the formation of a redeposition wall on at least one of the etched flanks of the resin made from said insulator, said wall extending in a given direction, d) elimination of the remaining resin, e) deposition of a superconducting material on the complete structure obtained in d) having a thickness less than the height of the wall, f) etching the superconducting material in the form of a ribbon perpendicular to said direction and having two separate portions on either side of the wall and bearing on the latter and g) producing two interconnection contacts respectively on the two separate portions of the superconducting ribbon.

In this embodiment, ionic machining of the substrate generally leads to the formation of two parallel insulating walls. In this case, it is preferable to eliminate one of the insulating walls.

According to a second variant of the production process, the following stages are performed:

A) deposition of a first superconducting material on an appropriate substrate made from an electrically insulating material, B) producing a thermally stabilized resin mask on the first superconducting material masking one portion of the first superconducting material, C) ionic machining of the masked first superconducting material and then the underlying substrate, leading to the formation of a redeposition wall on one of the etched flanks of the first superconducting material, made from said insulating material, said wall extending in a given direction, D) elimination of the resin mask, E) deposition of a second superconducting material on the complete structure obtained in D) having a thickness less than the height of the wall, F) producing a superconducting ribbon perpendicular to said direction by etching the second and then the first conducting material, having two separate portions located on either side of the wall, G) producing two interconnection contacts respectively on the two portions of the superconducting ribbon.

In general terms, the first and second superconducting materials are made from one and the same material.

The general production processes are those conventionally used in micro-electronics. In particular, the superconducting material deposition processes can be reactive or non-reactive cathodic sputtering, sublimation by laser or any other deposition process.

According to the invention, the insulating barrier is produced by using insulating redepositions of flanks observed during a dry etching with the aid of reactive or non-reactive, high energy ions. To obtain a vertical barrier, i.e. perpendicular to the plane of the layers, it is indispensable to make it grow on a vertical pattern. This is advantageously obtained by using the lithographic multilayer method.

Advantageously, the structure is cleaned before depositing the superconducting material following ionic machining. This cleaning can take place by ionic machining or plasma.

BRIEF DESCRIPTION OF THE DRAWINGS

The invention is described in greater detail hereinafter relative to non-limitative embodiments and with reference to the attached drawings, wherein show.

Figure 1:
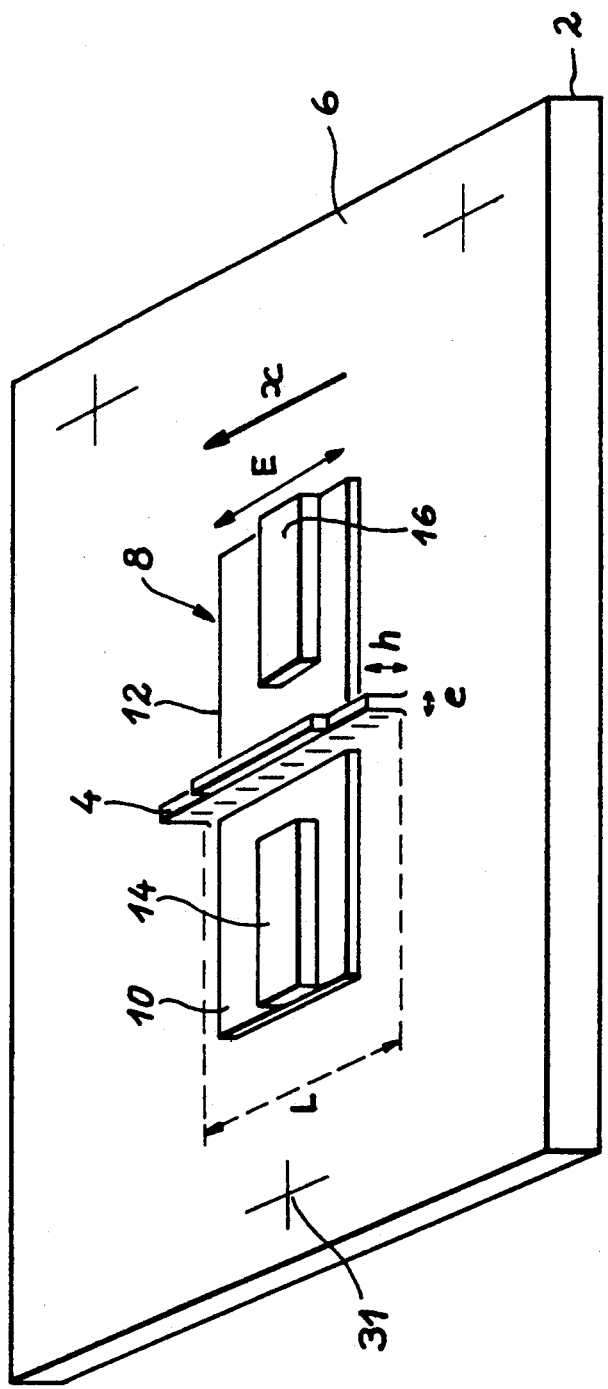
FIG. 1—Diagrammatically and in perspective a Josephson junction according to the invention.

The Josephson device or junction shown in FIG. 1 has an insulating material, e.g. MgO substrate 2, on which rests a vertical barrier or wall 4 made from an insulating material with a composition identical to that of the substrate 2 and therefore of MgO. This wall 4 extends longitudinally in a direction x parallel to the surface 6 of the substrate 2.

It has a height h of approximately 0.7 $\mu$m, a thickness e, measured in a direction perpendicular to the direction x, less than 10 nm and a length L, measured in the direction x, of several micrometres and typically 50 $\mu$m.

The junction also has a superconducting material ribbon 8 consisting of two separate portions 10, 12 located on either side of the insulating wall 4 and bearing on the latter. The superconducting ribbon 8 extends perpendicularly to the direction x.

The superconducting ribbon 8 can be made of $Bi_{1-z}Pb_zSr_{2-u}Ca_uCu_3O_7$ with $0<z<1$ and $0<u<2$ and has a thickness of approximately 300 nm. The ribbon width E is in particular less than the length L of the barrier, in order to ensure a good electrical insulation of the two superconducting portions 8 and 10.

According to the invention, the wall is located in a plane perpendicular to the crystallographic plane (a, b) of the superconducting material 8 and therefore the plane containing the copper atoms.

Finally on each superconducting portion 10, 12 there is an interconnection contact respectively 14 and 16 made from metal and in particular a gold and chromium alloy or a nickel and gold alloy. These contacts have a thickness of approximately 200 nm.

With reference to FIGS. 2a to 2h, a description is given hereinafter of a first embodiment of the Josephson junction according to the invention.

The first stages of this process relate to the production of a resin mask using the trilayer method on the insulating substrate. To this end deposition takes place in the manner shown in FIG. 2a of a lower approximately 1 $\mu$m thick, positive photosensitive resin layer 20 on the surface 6 of the substrate 2, which then undergoes thermal annealing at 135° to 200° C. for 30 to 60 minutes, as well as optionally ultraviolet irradiation in order to thermally stabilize the resin. It is then covered with a thin metal layer 22, typically with a thickness of 100 nm and e.g. of germanium or SiOx.

Figure 2A:
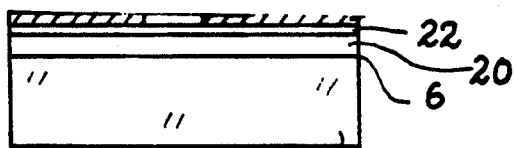
FIGS. 2a to 2h—Diagrammatically the different stages of producing a Josephson junction according to the invention in a first variant, FIGS. 2a to 2c and 2e to 2h being sectional views and FIG. 2d a perspective view.
Figure 2B:
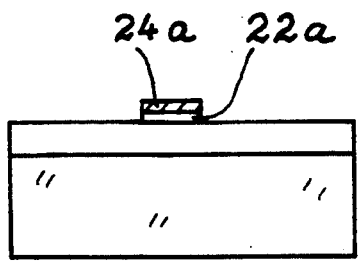

On the metal layer 22 is deposited an upper, positive resin layer 24, which is irradiated across a mechanical mask 26 masking the central region of the upper resin layer and therefore that substrate region on which the junction is to produced. After developing the resin 24 the structure shown in FIG. 2b is obtained. The resin pattern obtained carries the reference 24a.

This is followed by reactive ionic etching with fluorine-containing ions of the germanium layer 22, so as to eliminate all zones of the germanium layer not masked by the resin mask 24a. The metal pattern obtained carries the reference 22a.

Figure 2C:
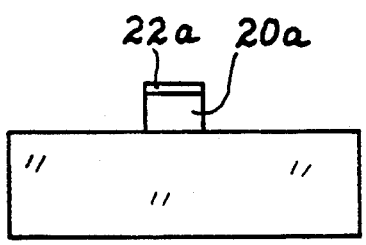
Figure 2:
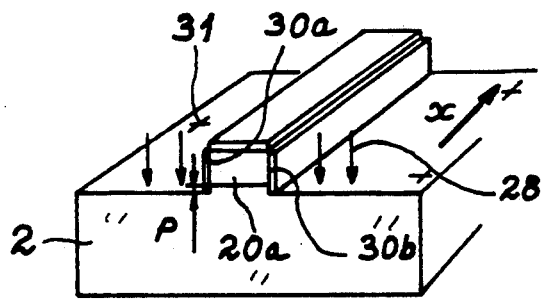

Following the elimination of the mask 24a, reactive ionic etching is carried out on the lower resin layer 20 in an oxygen atmosphere leading to the elimination of said resin not masked by the germanium pattern 22a. The structure obtained is shown in FIG. 2c. The lower resin pattern carries the reference 20a.

In the manner shown in FIG. 2d, this is followed by vacuum ionic machining 28 of the substrate 2 with the aid of a focused beam of Ar+ ions having an energy of 100 to 1000 eV and typically 400 eV. This machining of the substrate 2 takes place over a depth p of 50 to 300 nm.

Under these conditions, on the flanks of the resin mask 20, are obtained redeposits 30a, 30b of insulating material forming the substrate 2 and in this case MgO. These redeposits 30a, 30b have a thickness below 10 nm and extend parallel to the direction x.

Figure 2E:
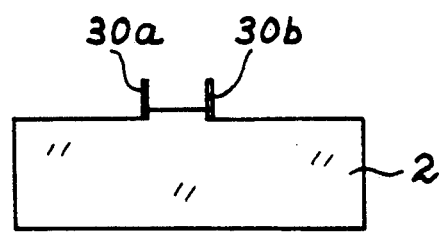

This is followed by the freeing of the insulating walls 30a, 30b by the elimination of the metal mask 22a by chemical action and then the resin 20a either by reactive ionic etching in an oxygenated medium, or with the aid of a solvent such as acetone. The structure obtained is shown in FIG. 2e.

This is followed by an option in situ cleaning of the barriers 30a, 30b and the substrate 2 with the aid of an oxygen plasma.

Figure 2F:
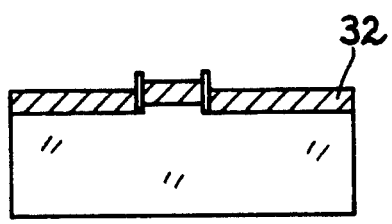

As shown in FIG. 2f, this is followed by the deposition on the complete structure of a source 32 of superconducting material, e.g. BiPbSrCaCuO, with a thickness of 300 nm. This deposition takes place by laser ablation.

Figure 2G:
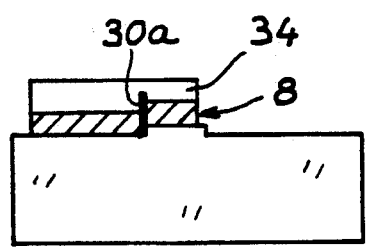
Figure 2H:
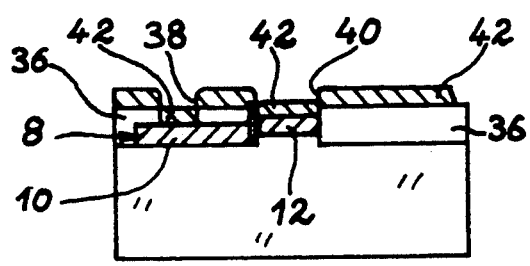

Then, as shown in FIG. 2g, a new photosensitive resin mask 34 is formed, which masks the region intended for the Josephson junction and in particular one of the insulating barriers 30a and the superconducting material positioned on either side of said barrier 30a.

This is followed by the etching of the superconducting material 32, e.g. with the aid of ionic machining using argon ions. This mask 34 makes it possible to define the ribbon 8 in the superconducting material 32

(cf. FIG. 1). After eliminating the resin mask 34, the structure shown in FIG. 2g is obtained.

According to the invention, the thickness of the superconducting layer 32 and therefore the superconducting ribbon 8 must at the most be equal to or preferably less than the thickness of the insulating barrier 30a.

Then, in the manner shown in FIG. 2g, a new resin mask 36 is formed, which masks the complete structure, with the exception of the two zones respectively 38 and 40 fixing the location and dimensions of the interconnection contacts to be produced respectively on the two superconducting portions 10, 12 of the ribbon 8. This is followed by the deposition by cathodic sputtering of a superconducting layer 42 based on chromium-gold or nickel-gold.

This is followed by the elimination of the resin mask 36, as well as the metal covering said resin (lift-off), e.g. with the aid of a solvent. The structure obtained is that shown in FIG. 1.

With the aid of the mask reference marking system 31 shown in FIGS. 1 and 2d, a respective alignment takes place of the resin masks 20a, 34 and then 36, with respect to the insulating barrier 30a.

With reference to FIGS. 3a to 3d, a description will be given hereinafter of a second variant for the production of the Josephson junction according to the invention. In this variant, firstly deposition takes place of a first superconducting material 50, e.g. of BiPbSrCaCuO with a thickness of 300 nm, on the MgO substrate 2. This material 50 is deposited by laser ablation.

This is followed by the production of a thermally stabilized resin mask 20b using the trilayer method described hereinbefore. This mask 20b is 1 um thick and masks part of the superconducting layer 50.

Figure 3A:
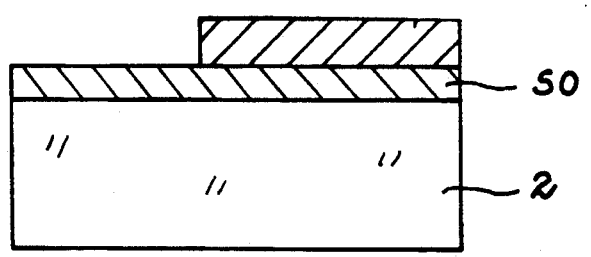
FIGS. 3a to 3d—Diagrammatically a second variant of the production of a Josephson junction according to the invention, FIGS. 3a, 3c and 3d being sectional views and FIG. 3b a perspective view.
Figure 3B:
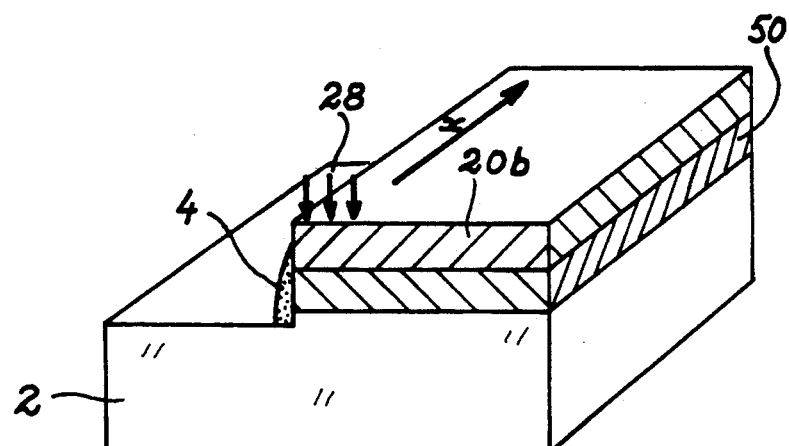

As shown in FIG. 3b, this is followed by ionic machining 28 of the superconducting layer 50 and then that of the substrate 2. The ionic machining conditions are as described hereinbefore. This leads to a deposit of an insulating barrier 4 having the same composition as the substrate 2 and which is therefore of MgO. This barrier 4 has the same characteristics as the barrier 30a described hereinbefore and is oriented in direction x.

Figure 3C:
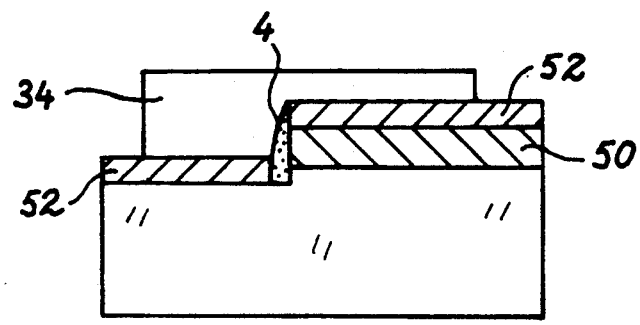

This is followed by the elimination by reactive ionic etching in an oxygenated medium of the resin mask 20b. The structure obtained is shown in FIG. 3c. This is followed by vacuum cleaning, e.g. using oxygen plasma, of the structure obtained.

On the complete structure obtained is then deposited a second 300 nm thick, superconducting material layer 52, e.g. by cathodic sputtering. This layer 52 is in particular of BiPbSrCaCuO like the upper superconducting layer 50.

Figure 3D:
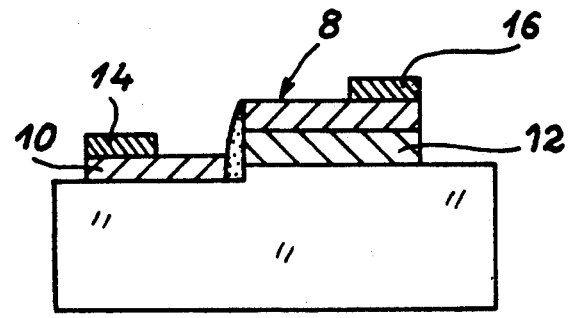

This is followed by the formation of the resin mask 34 masking in part the superconducting material 52 and the insulating barrier 4. With the aid of said resin mask 34, there is an etching of the superconducting material 52 and then the superconducting material 50, as described hereinbefore, in order to form the superconducting ribbon 8. The structure obtained is shown in FIG. 3d.

On the superconducting ribbon 8 obtained and which is here formed from two separate portions 10 and 12 of different thicknesses, are produced the two interconnection contacts 14, 16, as described hereinbefore.

Instead of producing the interconnection contacts by the lift-off method, it is possible to produce them in conventional manner by the deposition of a conductive layer and then etching the latter through a lithographic mask. It is also possible to carry out the deposition of the superconducting materials 32, 50, 52 using the lift-off method.

Instead of using photosensitive resins, it is also possible to use electrosensitive resins (e.g. polymethyl methacrylate).

I claim:

1. Process for the production of a Josephson junction comprising the steps of forming a step having at least one flank on an electrically insulating material substrate, the step being formed of a material different from that of the substrate, machining the substrate with a focused ion beam to form on the flank of the step a vertical redeposition wall made of said insulating material and extending in a given direction, forming a superconducting ribbon oriented perpendicularly to the wall and having two separate portions located in a single plane on opposite sides of the wall and bearing on the latter, and providing two interconnection contacts respectively on the two separate portions of the ribbon.

2. Process according to claim 1, including the further steps of:
   a) depositing a resin layer on said substrate prior to forming said step,
   b) the step of forming the step including etching the resin layer to mask only that region of the substrate on which the junction is to be produced and forming said at least one flank of etched resin,
   c) the step of machining the substrate comprising ionic machining the masked substrate with the formation of the redeposition wall on said at least one flank of etched resin,
   d) eliminating the remaining resin,
   e) the step of forming the superconducting ribbon including depositing superconducting material having a thickness less than the height of the wall on the complete structure obtained in step (d), and
   f) etching the superconducting material to form said superconducting ribbon.

3. Process according to claim 2, wherein the step of machining the substrate with a focused ion beam includes forming two flanks of etched resin on the step, the ionic machining step includes forming two redeposition walls on the flanks of the step, and one of the walls is eliminated during step (f).

4. Process according to claim 1, comprising the further steps of:
   a) depositing a first superconducting material on said substrate,
   b) producing a thermally stabilized resin mask on the first superconducting material, said resin mask masking one portion of the first superconducting material to form said step and at least one flank,
   c) said machining step including ionic machining the masked first superconducting material and then the underlying substrate to form the redeposition wall on one side of the flank of the first superconducting material,
   d) eliminating the resin mask,
   e) depositing a second superconducting material on the complete structure obtained in step (d), said second superconducting material having a thickness less than the height of the wall, and
   f) the step of forming the superconducting ribbon including etching the second and then the first superconducting material.

5. Process according to claim 4, wherein the first and second superconducting materials are identical.

6. Process according to claim 1, wherein the substrate is of MgO.

7. Process according to claim 6, wherein machining is carried out with an argon ion beam having an energy of 100 to 1000 eV.

8. Process according to claim 2, wherein the structure is cleaned prior to the deposition of the superconducting material following ionic machining.

9. Process according to claim 1, wherein the step is formed by lithography using the trilayer method.

10. Process according to claim 1, wherein the redeposition wall is perpendicular to the crystallographic plane of the superconducting ribbon.

* * * * *